United States Patent [19]

Kozel

[11] Patent Number: 5,641,297
[45] Date of Patent: Jun. 24, 1997

[54] ZERO INSERTION FORCE MINIATURE GRID ARRAY SOCKET

[75] Inventor: Charles A. Kozel, McHenry, Ill.

[73] Assignee: Methode Electronics, Inc., Chicago, Ill.

[21] Appl. No.: 495,809

[22] Filed: Jun. 27, 1995

Related U.S. Application Data

[63] Continuation-in-part of Ser. No. 382,519, Feb. 1, 1995.

[51] Int. Cl.⁶ ..................................... H01R 4/50
[52] U.S. Cl. ............................... 439/342; 439/259
[58] Field of Search ............... 439/342, 259–270, 439/68, 70

[56] References Cited

U.S. PATENT DOCUMENTS 4,744,768  5/1988  Rios ........................................ 439/262
5,419,710  5/1995  Pfaff ........................................ 439/266
5,489,217  2/1996  Scheitz et al. ......................... 439/342

Primary Examiner—Hien Vu
Attorney, Agent, or Firm—David L. Newman

[57] ABSTRACT

A zero insertion force ball grid array socket comprises a base having an array of passages and contacts mounted therein. A carrier for receiving the ball grid array package and slidingly movable from a nonmated position to a mated position. The contacts having surface mount tails exposed in a perpendicular direction above the base and the balls of the ball grid array package being inspectable from the opposite side of the carrier receiving the ball grid array package thereon. The carrier includes carrier arms having cells for receiving balls of the ball grid array package and the cells having an enlarged circumference due to ball support means projecting therefrom.

20 Claims, 4 Drawing Sheets

ZERO INSERTION FORCE MINIATURE GRID ARRAY SOCKET

This is a continuation-in-part application of U.S. Ser. No. 08/382,519, filed Feb. 1, 1995, which is issued Dec. 10, 1996.

BACKGROUND OF THE INVENTION

This invention pertains to an electrical connector and, in particular, a zero insertion force miniature grid array socket for integrated circuit packages such as ball grid arrays or pin grid arrays.

Integrated circuits (I.C.s) have become the world's standard for electronic circuits. These range from basic transistor networks to complex memory, microprocessor and multichip module circuits. The common denominator to all such circuits is that they are produced en mass on a substrate such as silicon and then separated into individual units commonly known as chips. The majority of chips are then mounted in a carrier for subsequent incorporation into end products. The basic size, shape and construction of the carrier is commonly known as the package and many standard packages have emerged. Some examples are commonly known as D.I.P. S.O.J., P.L.C.C., Q.F.P. and B.G.A. Chip packages have developed to accommodate both circuit function, i.e., number and placement of the leads, and assembly trends, i.e., thru-board and surface mount solder assembly. While the majority of I.C. devices are hard soldered in place, several factors such as device availability, testing, upgrades, etc., have traditionally shown that there is a need to socket I.C.s, regardless of their package. In fact, I.C. sockets are known in the art for receiving pin grid array packages (PGA) on 0.100 inch×0.100 inch spacing. However, there are many miniature I.C. packages which have spacing less than 0.100 inch×0.100 inch. As I.C. packages become more miniaturized, it is desirable to socket these packages. It is the intent of this invention to provide a simple, economical, reliable and space-efficient socketing system, targeted for today's high pin count, miniature I.C. packages such as miniature grid array packages which include ball grid arrays (BGA) packages and pin grid array packages.

Accordingly, it is an object of the present invention to provide a socket which may intermate with various miniature I.C. packages.

It is another object of the present invention to provide a socket which intermates with a miniature grid array package.

It is a further object of the present invention to provide a socket having a footprint identical to the I.C. package mounted thereto.

It is a further object of the present invention to provide a surface mount socket.

It is also an object of the present invention to provide a socket which has no real estate penalty on a printed circuit board.

It is another object of the present invention to provide a socket having a zero insertion force.

It is another object of the present invention to provide a socketing system in which the I.C. package is not subject to reflow soldering.

It is a further object of the present invention to provide a socket which allows for inspectability and repairability of contact solder joints.

It is also an object of the present invention to provide a socket having a low profile.

It is a further object of the present invention to provide a socket which provides for metal-to-metal connections.

It is another object of the present invention to provide a socket having low self inductance.

It is also an object of the present invention to provide a socket which does not deform the balls of a BGA package.

SUMMARY OF THE INVENTION

According to the above objects of the present invention, a miniature grid array socket is provided comprising a base having an array of passages, contacts mounted in the passages, a carrier mounted to the base, an a miniature grid array package mounted to the carrier and the miniature grid array package slidingly mating with the contacts. The carrier is mounted to the base with a zero insertion force. The carrier member includes slots which allow for the inspection of the mated miniature grid array package mounted thereto. The array of contacts provide a footprint of the socket corresponding to the miniature grid array package mounted thereto. The socket includes metal-to-metal connection between the socket and the miniature grid army package.

The miniature grid array socket includes carrier arms arranged in rows on the carrier, slots between the carrier arms, cells arranged in an array on the carrier arms for receiving balls, contacts of the base protruding through the slots adjacent the carrier arms, carrier channels of the base for receiving the carrier arms, and the carrier being slidingly movable on the base. The socket contacts are oriented in rows alternatingly on opposite sides of the carrier arms.

A zero insertion force ball grid array socket is provided comprising a base having an array of passages therein, contacts mounted in the passages, a ball grid array package having balls protruding therefrom, a means for receiving the balls in a nonmated position with a zero insertion force, and a means for slidingly mating the balls to the contacts. The receiving means and the sliding means include a carrier having carrier arms having an array of cells for receiving the balls and slidingly mounted to the base. The socket includes carrier guides protruding from the base and defining rows of carrier channels and passages. Contacts include surface mount tails, shoulders, a beam and a head having a serpentine shape. The rows of contacts are alternatingly positioned on opposite sides of the carrier arms. The carrier includes an indentation along its outer edge allowing for insertion of a pry tool to aid in the sliding of the carrier into a mating position. The socket includes contacts having surface mount tails which are exposed in the upward perpendicular direction while the socket is carded on a circuit board. The receiving means are arranged in rows having slots therebetween and the passages are arranged in rows corresponding to the slots. The base includes an aperture having a rectangular shape corresponding to a carrier mounted therein. The aperture is of a length greater than the length of the carrier by a measure equal to the distance the balls are slid into a mated position. The socket includes two hundred and fifty-six passages. The socket includes contacts on a 0.050 inch grid.

A method of assembling a miniature grid array socket includes the steps of mounting a base to a printed circuit board, mounting a miniature grid array package to a carrier, mounting the carrier/miniature grid array package assembly to the base having contacts in a nonmated position and slidingly mating the carrier/miniature grid array package assembly to the contacts.

A miniature grid array socket is provided comprising a base having an array of passages, contacts mounted in the passages, a carrier mounted to and slidably movable on the base having arms arranged in rows on the carrier, slots between the carrier arms, and cells arranged in an array on the carrier arms having a cell wall including a ball support means for receiving balls of a miniature grid array package.

These and other features of the invention are set forth below in the following detailed description of the presently preferred embodiments.

DETAILED DESCRIPTION OF THE PRESENTLY PREFERRED EMBODIMENT

Figure 1:
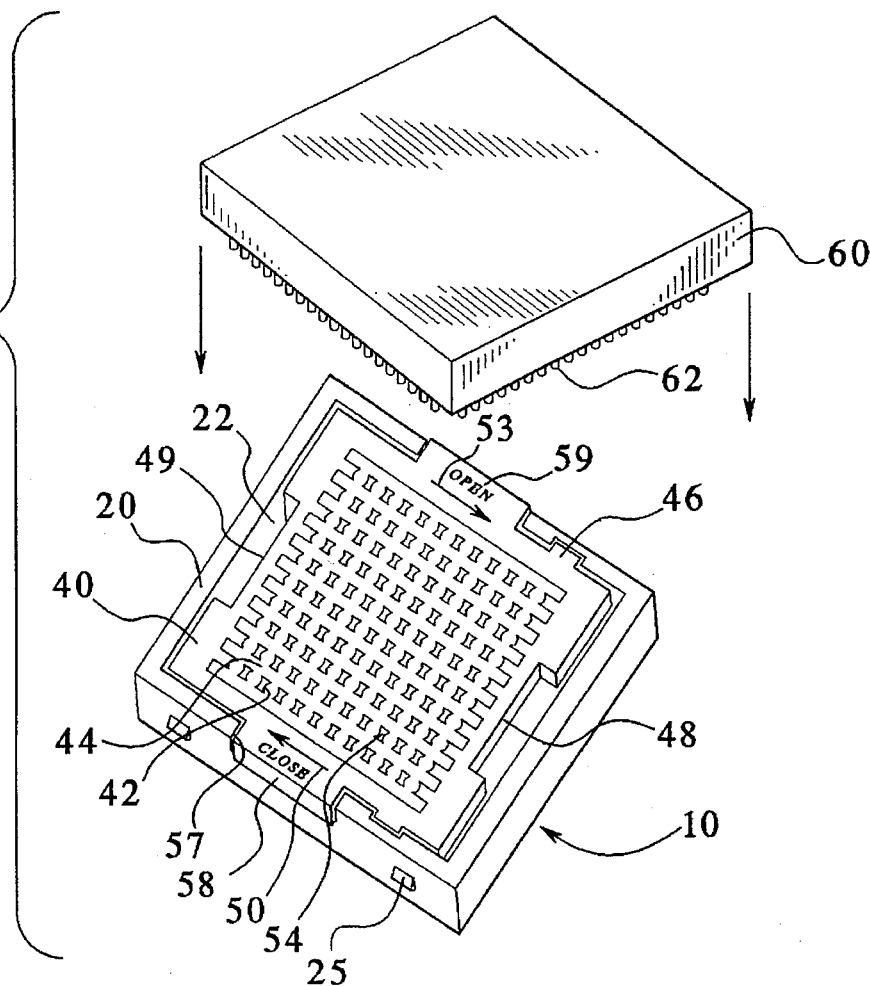
FIG. 1 is an exploded perspective view of the socket of the present invention.

An embodiment of the miniature grid array socketing system of the present invention is best understood by FIGS. 1–7. Turning to FIG. 1, socket 10 is shown having base 20 and carrier 40. The carrier 40 includes an array of cells 42, corresponding to the balls 62 of BGA package 60. In a preferred embodiment, the BGA package 60 includes two hundred and fifty-six balls on 0.050 inch×0.050 inch grids, using 0.031/0.039 inch ball diameters, such as JEDEC MO-156. In a preferred method of assembling the socket 10, the base 20, having the carrier 40 removed, is mounted to a printed circuit board. It should be noted that FIG. 1 shows the carrier 40 mounted in the base 20 prior to mounting of the BGA package 60 thereto. This arrangement is shown only for ease of description and is not indicative of the preferred method of assembly. The contacts of the base 20, as discussed below, have surface mount tails to allow for the efficient and quick surface mounting of the base 20 to a printed circuit board. The base 20 alone is exposed to solder temperatures for mounting to the printed circuit board and then cleaning operations. The base is arranged to allow for inspection of the solder joints of the soldered surface mount tails. Following inspection, the final assembly of the socket may occur. The BGA package 60 is then mounted to the carrier 40. The balls 62 of the BGA package 60 are received by cells 42 of the carrier 40. The present design allows for the balls 62 to protrude beyond the carrier arms 54 into slots 44, so that the carrier 40 may be turned over to allow for inspection of the BGA package 60 mounted thereto. The arrangement of the carrier 40 having slots 44, allows for the balls 62 to be viewed from the underside of the carrier 40, to be sure that all of the balls 62 are properly aligned in the corresponding cells 42.

Once the BGA package has been mounted to the carrier 40 and inspected, the combination BGA package 60 and carrier assembly 40 may be mounted to the base 20. The base 20 includes aperture 22 being rectangular in shape. The carrier 40 is dropped into the aperture 22 so that a key 46 is properly aligned to the base 20. The carrier 40 is mounted within the base 20 in a nonmated position and requires a zero insertion force. Subsequent to mounting within the aperture 22, the carrier 40 may be moved to the closed position in direction of arrow 52 by camming the carrier 40 into place by insertion of a camming tool in indentation 48. A tool such as a screwdriver or coin may be used to slide the carrier 40 in direction of arrow 52 so that the balls 62 of the mated BGA package 60 will become mated to the contacts of the base 20. Finger grips 58, 59 project from the sides of the carrier 40 and both guide the sliding of the carrier 40 and provide a gripping surface for removal of the carrier 40 from the base 20. The finger grips 59, 59 have a length shorter than the opening in which they are received so that the carrier may slide the distance of the gap provided between the finger grips 58, 59 and the sides of the opening 57. The gap is limited to the sliding distance required only for a ball 62 to move from a nonmated position to a mated position, and no further. Thus, the finger grips 58, 59 prohibit the balls 62 from sliding into multiple mated positions. Also protruding from the base 20 are clip mounts for heat sinks 25 or retention clips 25.

For removal of the carrier 40 from the base 20, the carrier 40 may be moved back to its nonmated position by insertion of a pry tool against indentation 49 for movement of the carrier in direction of arrow 53 so that the balls 62 slide out of their mating relationship with the contacts of the base 20. The earlier 40 may then be removed from the aperture 22 via hand removal by grasping finger grips 58, 59 which extend out from under the sides of the BGA package 60, mounted thereto. In a preferred embodiment, the socket 10 is injection molded of a polymer material such as liquid crystal polymer.

Figure 2:
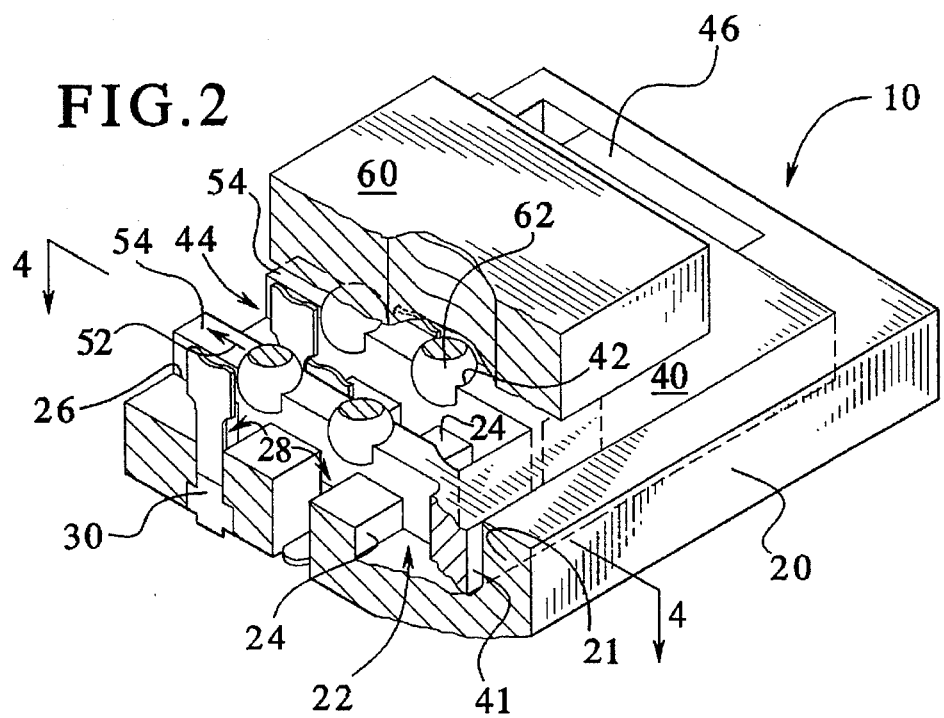
FIG. 2 is a perspective cut-away view of the socket of the present invention in a nonmated position.

Turning to FIG. 2, the socket 10 is shown in its fully assembled state. The base 20 is shown partially cut-away so that the carrier 40 mounted therein and having balls 62 mounted thereon are exposed for viewing. The carrier 40 is shown in a nonmated position so that the first edge 41 of carrier 40 abuts up against first wall 21 of the base 20. The carrier 40 is seated within aperture 22. The aperture 22 is generally rectangular in shape, corresponding to the rectangular shape of the carrier 40. However, the aperture 22 is enlarged slightly so that the carrier 40 may slide therein. However, in a preferred embodiment, the aperture 22 may only be 0.025 inches larger in one direction than the carrier 40, as this is the distance to move the BGA package 60 from its nonmated to its mated position. The aperture 20 includes rows of carrier guides 24 which define carrier channels 26 which receive carrier arms 54. The carrier guides 24 also define and surround passages 28 into which contacts 30 are mounted.

Mounted to the carrier 40 is the BGA package 60. The balls 62 of the BGA package are shown cut away from the BGA package 60 so that the socket 10 may be clearly viewed. However, it may seen that the balls 62 are attached to the underside of the BGA package 60. The balls 62 are soldered to the BGA package and via leads are attached to the I.C. The balls 62 are mounted to cells 42 of carrier arms 54. The cells 42 are shaped corresponding to the size of the balls in order to support the balls in the X-Y axis to allow transfer of movement of carrier in direction of arrow 52 to the balls 62 and BGA package 60. The width of the carrier arms 54 is less than the diameter of the balls 62. Therefore, upon mounting of the BGA package 60 to the carrier 40, the balls 62 protrude from the sides of the cells 42 on the carrier arms 54. Slots 44 are formed between the carrier arms 54 so that an opening through the entire carrier 40 is formed, enabling the inspection of the balls 62 from the bottom side of the carrier 40. Thus, after mounting of the BGA package 60 to the carrier 40, and prior to mounting the carrier to the base 20, inspection may be made of the BGA package 60 mounted to the carrier 40. By turning over the combination carrier 40 and BGA package 60 assembly, it can be seen through slots 44 that the balls 62 have been properly seated in corresponding cells 42 on the carrier arms 54. In a preferred embodiment, the BGA package 60 may also include a polarizing means to help orient the BGA package 60 to the carrier 40 so that all of the balls 62 align properly in their corresponding cells 42. After inspection, the combination carrier 40 and BGA package 60 mounted thereto are in turn mounted to the base 20.

The carrier 40 is mounted within the aperture 22 of the base 20 and aligned therein by lining up key 46 and also by inserting carrier arms 54 within carrier channels 26 of the aperture 22 of the base 20. Upon insertion of the carrier 40 within the aperture 22, the carrier 40 is located in its nonmated position, so that the balls 62 are adjacent, but not mated to contacts 30. As discussed above, the carrier 40 may be slid in the direction of arrow 52 so that the balls 62 are mated with contacts 30. Zero insertion force is required to mount the carrier 40 on the base 20 in a nonmated position. This is especially advantageous for high density grid array packages. Multiple numbers of balls 62 of the BGA package 60 exponentially increases any insertion forces. Such high insertion forces could prohibit socket designs. In the preferred embodiment, the BGA package 60 includes two hundred and fifty-six bails 62. Thus, even an insertion force of a sixteenth of a pound per bail could become excessive and prohibit the mounting of the BGA package without the aid of mechanical assistance. In the present design, such great forces have been made unnecessary due to the zero insertion force mounting of the carrier 40 in a nonmated position.

Figure 3:
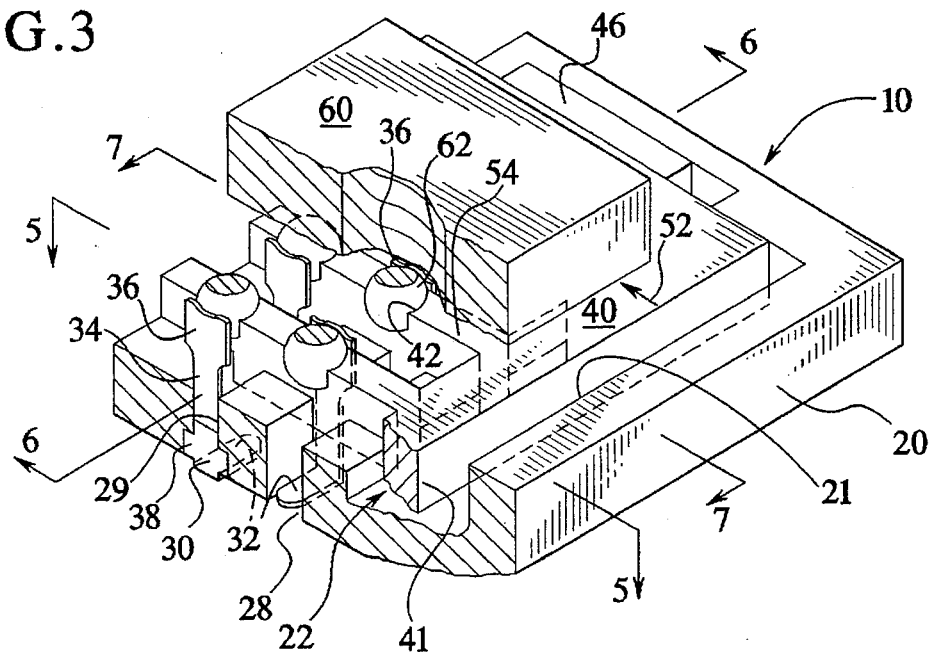
FIG. 3 is a perspective cut-away view of the socket of the present invention in a mated position.

Turning to FIG. 3, the combination carrier 40 BGA package 60 assembly is shown in its mated position where balls 62 have been slid into position next to and in electrical contact with contacts 30. It can be seen that the carrier 40 has been slid in direction of arrow 52 and the first edge 41 is no longer in abutting contact with the first wall 21 of aperture 22 of the carrier 20. As the combination carrier 40 and BGA package 60 mounted thereto are slid in direction of arrow 52, the balls 62 mounted in cells 42 of carrier arms 54 of the carrier 40 are slidingly mated with the contacts 30.

The contacts 30 include a surface mount tail 32, an angled working beam 34, a head 36 and shoulders 38. Assembly of the contacts 30 to the carrier 20 occurs by insertion of the contact 30 through the bottom of the carrier 20. The contact head 36 and beam 34 are slid up and through retention slots 29 until shoulders 38 abut the bottom of the retention slot 29 providing for the press-fit of the contact 30 therein. The head 36 of the contact 30 includes a serpentine shape to ensure the positive mating of the balls 62. It can also be appreciated that due to the contact design the base 20 includes the standard BGA footprint. As the contact tails 32 are directly below the balls 62 to which they are mated, the same footprint is retained. Therefore, no increased real estate is required and the size of the BGA package 60 approximates the actual size of the socket 10. It may be seen that the contacts 30 are alternatingly positioned on either side of the carrier arms 54. This alternating orientation of the contacts 30 provide for an even force against the BGA package and combined pressure in a single direction against the BGA package 60 occurs.

It can be seen that surface mount tails 32 of contacts 30 are exposed below the base of the carrier 20. This arrangement allows for the quick and efficient surface mounting of the base 20 to a printed circuit board. As the tails 32 are positioned in passages 28, the tails may be viewed from perpendicularly above the base 20, prior to mounting of the carrier 40 and BGA package 60 thereto. In a preferred embodiment, prior to mating of the BGA package 60. The base 20 is positioned on a printed circuit board via polarizing pegs. The printed circuit board and base 20 may then be exposed to heat and wave soldered. After soldering, the contact tails 32 and their solder joints may be inspected from above the passages 28. Should a proper electrical contact of the surface mount tail 32 have not been achieved, the passage 28 allows for the insertion of an instrument to reflow the solder for that contact tail 32. The design of the present invention provides for a single reflow step of the base 20 to a printed circuit board. A second reflow step after mounting of the BGA package 60 is not required. Exposure to heat occurs only to the base and not the BGA package 60. As the balls 62 are attached to the BGA package via solder, such a reflow process could be harmful to the attachment of the balls 62. Therefore, any degradation of the balls 62 of the BGA package 60 is avoided. Following mounting of the base 20 to the printed circuit board, the BGA package 60 mounted to the carrier 40 may then be mounted in the aperture 22 of the base 20.

Figure 4:
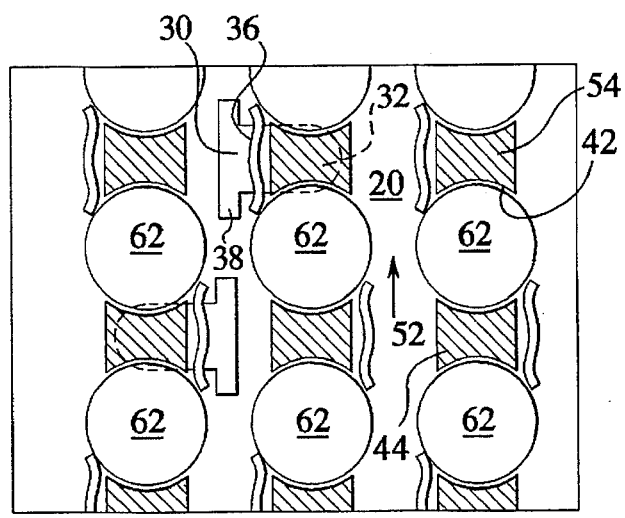
FIG. 4 is a plan view of FIG. 2, taken at line 4—4.

Turning to FIG. 4, a sectional plan view of FIG. 2 taken at line 4—4 is shown. Carrier arms 54 of the carrier are mounted to the base 20 in a nonmated position. Balls 62 are mounted within cells 42 of the carrier arms 54. The balls 62 are mounted adjacent to contacts 30. The contacts 30 include contact head 36, surface mount tail 32 and shoulders 38. It can be seen that the diameter of the balls 62 is greater than the width of the carrier arms 54 and the edges of the balls 62 protrude form the cells 42. As the slots 44 adjacent the carrier arms 54 continue all the way through the carrier, the protruding sides of the balls 62 are visible and inspectable from the bottom of the carrier. Therefore, after the BGA package is mounted to the carrier, the positioning of the balls 62 within cells 42 are inspectable. After mounting of the carrier to the base 20, the carrier is moved in direction of arrow 52 to mate the balls 62 to the contacts 30 and with the contact heads 36.

Figure 5:
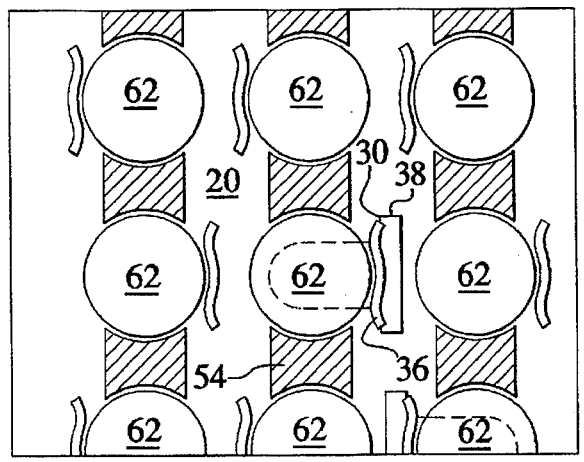
FIG. 5 is a plan view of FIG. 3 taken at line 5—5.

Turning to FIG. 5, a sectional plan view of FIG. 3 taken at line 5—5 is shown. The balls 62 are shown in a mated position with contacts 30. The contact head 36 is in abutting relationship to the balls 62. In comparing the position of the contact head 36 from its mated position in FIG. 5 to its nonmated position in FIG. 4, it can be seen that the head 36 has moved transverse to the direction of the carrier arms 54 so that it is positioned above the shoulders 38 of the contact 30. The sliding engagement of the balls 62 causes the head 36 to resiliently move away from the carrier arms 54. The serpentine shape of the contact head 36 allows for the balls 62 to slide therepast. The contact head 36 has a dip at its center portion which provides for the centering of the balls 62 on the contact head 36. Therefore, upon sliding of the carrier into position, there will be a positive alignment point of all of the balls 62 centered upon heads 36 of the contacts 30.

Figure 6:
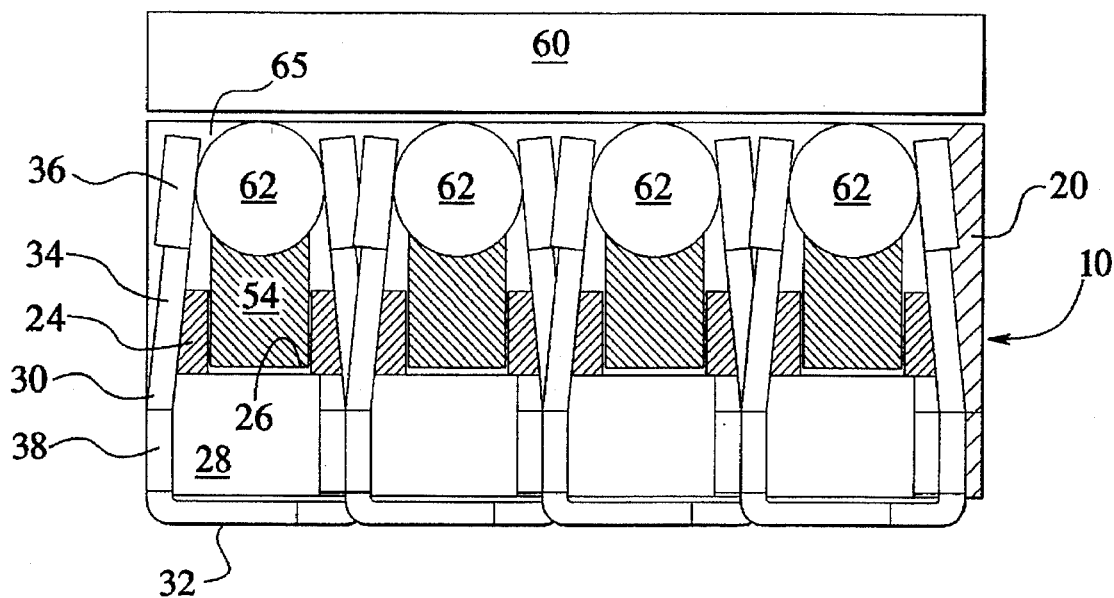
FIG. 6 is a side elevation cut-away view of FIG. 3, taken at line 6—6.

Turning to FIG. 6, a slide elevation cut-away view of FIG. 3 is shown taken at line 6—6. Contacts 30 are shown in a mated position with balls 62. The contacts include beam 34, head 36, shoulders 38 and surface mount tails 32. It can be seen that the beam 34 is angled toward the carrier arms 54. The contact head 36 is offset towards the top half of the balls 62. The contact head 36 being above the equator of the balls 62 provides for a downward force and a more positive electrical connection between the contact 30 and the BGA package 60. The beam 34 as shown in FIG. 6 in its mated condition provides a normal force of the contact head 36 against the balls 62. When the balls 62 are in a nonmated position, the beam 34 has an increased angle towards the carrier arms 54. The carrier arms 54 are mounted in carrier channels 26 which are formed by the carrier guides 24.

The balls 62 are shown attached to the BGA package 60 via solder 65. The preferred embodiment of this invention includes BGA packages 60 which have nondeformable balls 62. These balls 62 are generally formed of hard metallic materials and will not deform under input of heat. However, the present invention may also accept deformable balls generally made of tin-lead materials.

It can be seen that below the balls 62 is passage 28 which is open to the surface mount tail 32 below. It can be seen that the surface mount tail 32 is inspectable through passage 28 when the BGA package 60 is removed. It is also apparent that the surface mount tails 32 project below the bottom of base 20 to provide for the surface mounting of the surface mount tails 32 to a printed circuit board.

Figure 7:
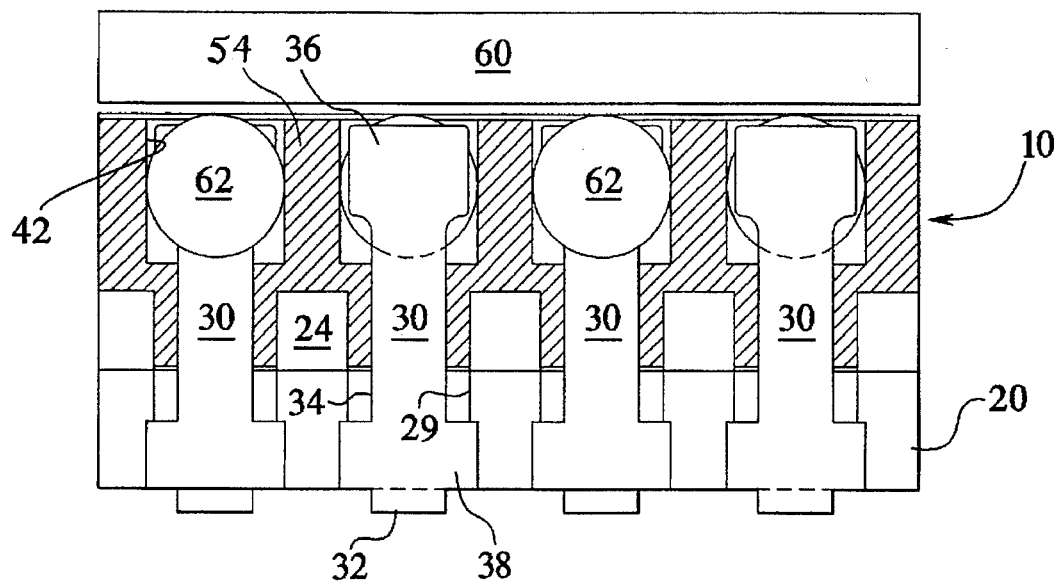
FIG. 7 is a side elevation cut-away view of FIG. 3, taken at line 7—7.

Turning to FIG. 7, a side elevation cut-away view of FIG. 3, taken at line 7—7 is shown. The balls 62 are shown in mated orientation with contacts 30. The balls 62 are shown mounted within cells 42 of the carrier arms 54. It can be seen that the contact 39 is mounted in retention slot 29 which is broad enough to allow head 36 and beam 34 to slide therethrough. However, shoulders 38 abut against the bottom of the retention slot 29 and provide a press-fit of the contact 30 therein. The surface mount tails 32 protrude below the bottom of the base 20 and provide for surface mounting of the socket 10 to a printed circuit board.

In a preferred embodiment, the contacts have an overall height of 0.090 inch and a beam having a width of 0.020 inch and a head having a width of 0.030 inch. The deflection of the beam is 0.006 inch and provides for at least one hundred grams of normal force against the balls. In a preferred embodiment, the contacts may be formed on a two-up progressive die having the contacts alternatingly mounted so that the contact tails alternate in their direction on the die so that a row of contacts may be gang loaded within the base 20 of the socket 10. The contacts in a preferred embodiment are stamped on the progressive die on 0.050 inch spacing. It may be appreciated from the present invention that the overall additional height added to the BGA package is approximately 0.060 inch. The overall height of the socket is approximately 0.090 inch. As the balls are inserted within the socket to approximately 0.030 inch, there is only an additional 0.060 inch added to the profile of the BGA package, as compared to mounting directly to the board. In a preferred embodiment, the contacts are a metallic material such as beryllium copper.

Figure 8:
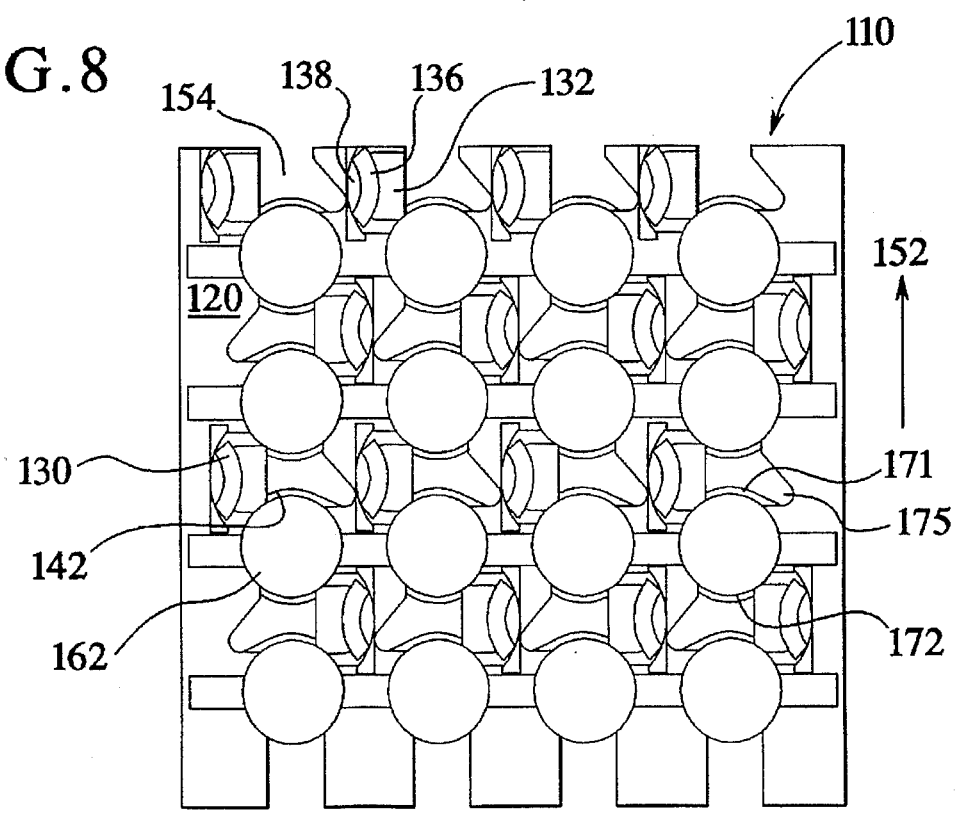
FIG. 8 is a plan view of an alternative embodiment of the present invention in a nonmated position.

Turning to FIG. 8, an alternative embodiment of the present invention is shown. This plan view of a section of a socket 110, includes carrier arms 154 of a carrier mounted to a base 120 in a nonmated position. Balls 162 are mounted within cells 142 of the carrier arms 154. The balls 162 are mounted adjacent to contacts 130. The contacts 130 include contact head 136, surface mount tail 132 and shoulders 138. The cells 142 include two semi-circular shaped cell walls 171, 172 which bound a ball 162 on opposite sides. Cell wall 171 includes a ball support means 175 which extends from the center line of the carrier arm 154 a distance equal to or greater than the radius of the ball 162. This extended member 175 provides for support of the ball 162 when the carrier is in a mated position. The earlier is moved in direction of arrow 152 in order to mate the balls 162 with the contacts 130. The contacts 130 of the alternative embodiment have semi-circular shaped heads 136. The semi-circular shaped contact head 136 shown in FIG. 8 is different from the serpentine-shaped contact head shown in FIGS. 2–5. The alternative embodiment having semi-circular shaped contact heads 136 provide for tighter spacing or higher density socket and also provide for lower insertion forces due to the abutment of the circular-shaped balls 162 against the semi-circular shaped contact heads 136. The semi-circular shape of the contact heads 136 provides for a larger radius than the serpentine-shaped contact heads shown in FIGS. 2–5 and therefore provides a more gradual abutment surface against the balls 162 and reduces the insertion forces of the carrier moved into its fully mated position on the socket base. It should be noted that the ball support means 175 alternate along the longitudinal axis of the carrier arms 154, corresponding to the alternating contacts 130.

Figure 9:
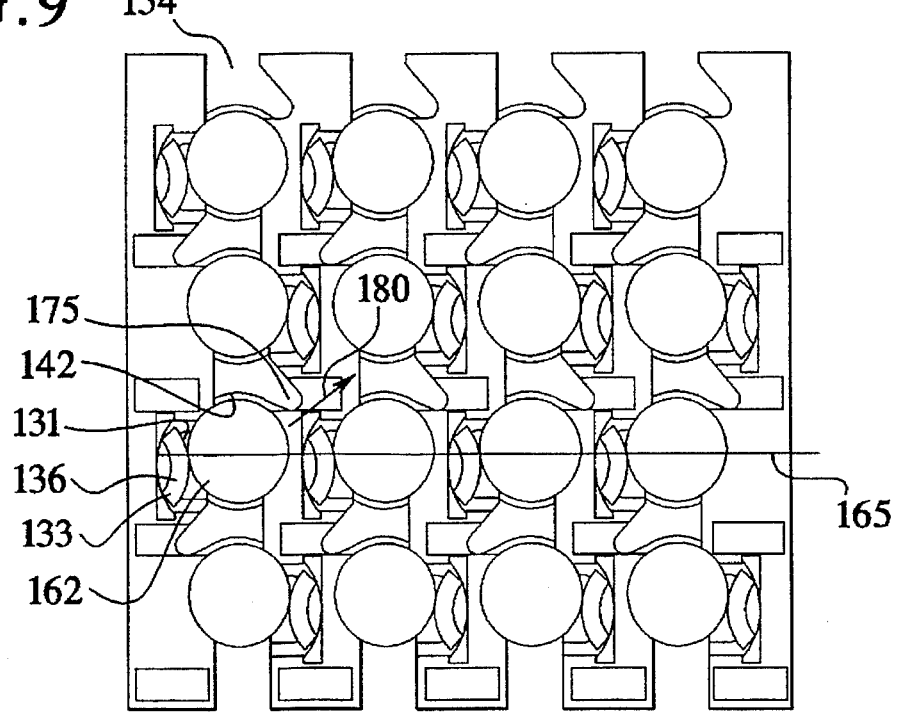
FIG. 9 is a plan view of the alternative embodiment shown in FIG. 8 in a mated position.

Turning to FIG. 9, a plan view of the alternative embodiment of FIG. 8 is shown in a mated position. It can be seen that ball 162 has been slid into mating contact with contact head 136. The carrier and carrier arms 154 are designed so that upon sliding of the carrier to mate the balls 162 with the contact heads 136, they reach their fully mated position so that the apex point 131 of the contact heads 136 is offset from the center line 165 of the balls 162. Thus, upon mating of the balls to the contact heads 136, the balls 162 will come into abutting contact with the first side 133 of the contact heads 136, slide past and toward the apex 131 of the contact heads 136 and then pass the apex into its offset mated position. The carrier and carrier arms 154 are precision formed so that upon sliding of the carrier within the aperture of the base, the carrier abuts the end wall of the base when the balls inserted in the carrier achieve the offset mated position as shown in FIG. 9.

The offset position of the balls 162 in relation to the contact heads 136 provides for a tactile feel to the mating of the carrier within the base and allows for support of the ball 162 by the ball support means 175. The tactile feel of the engagement of the carrier in its fully mated position occurs in that each of the balls 162 of the mated BGA package provide maximum resistance against the contact heads 136 when they are at the apex point 131 of the contact heads 136. As the fully mated position of the carrier in the base of the socket is achieved after the balls 162 slide past the apex point 131 of contacts 130, a lessening of the forces of the contacts 130 against the balls 162 occurs. This lessening of resistance against the balls can be felt in a tactile manner on the carrier so that it will feel to the operator that the carrier has "clicked" into position. Furthermore, the contact heads 136 are located at the end of a contact beam which allows for the flexing of the contact. The resiliency of the contact head 136 in a lateral direction due to the abutting and sliding of the ball thereon, provides an audible "click" sound that may be heard after the ball 162 slides past the apex 131 of the contact 130.

Further, as the apex point 131 of the contact heads 136 is offset from the center line 165 of the balls 162, the force that the contact heads 136 puts on the ball 162 in its mated position is skewed and occurs generally in the direction of arrow 180 causing the ball 162 to be pushed generally against the support means 175 of the carrier arm 154. The protruding support means 175 provides a backup support means for the ball 162 so that the normal forces put on the balls 162 while they are in a fully mated position are distributed to the ball support means 175. Having the enlarged circumference of the cells 142 of the carrier arms 154 due to the ball support means 175 provides additional surface area around the balls 162. In certain embodiments of BGA packages, the balls are formed of solder which may have a tendency to deform under prolonged periods of compaction. The ball support means 175 lessens the stresses placed directly on the balls and prevents any deformation of such balls 162. The ball support means 175 only extends on a single side of the ball 162. The ball support means 165 alternate along the sides of each carrier arm 154, corresponding to the alternatingly arranged contacts and contact heads 136. This arrangement ensures that there is clearance between the carrier arms 154 and the adjacent contact heads so that the sliding of the carrier arm 154 is unencumbered. As the socket base and the carrier are arranged so that there is only a single nonmated position as shown in FIG. 8 and a single mated position for the carrier as shown in FIG. 9, the protruding ball support means 175 will not interrupt the travel of the carrier within the base. For example, the carrier does not have multiple fully mated positions in that the balls could slide past multiple contacts. Once the ball has achieved its fully mated position as shown in FIG. 9, it can only slide backwards to its unmated position and not continue onwards to engage a second contact. Thus, the arrangement of the alternating ball support means 175 on the carrier arms 154 achieves the support of the balls without interfering with the desired motion of the carrier within the socket base. The arrangement of the alternating ball support means 175 also provide for the high density arrangement required for many BGA packages.

It should be understood that various changes and modifications to the presently preferred embodiments described herein will be apparent to those skilled in the art. For example, various size grids may be accommodated by the present design. Such changes and modifications may be made without departing from the spirit and scope of the present invention and without diminishing its attendant advantages. It is, therefore, intended that such changes and modifications be covered by the appended claims.

What is claimed is:

1. A miniature grid array socket comprising:
    a base having an array of passages;
    contacts mounted in said passages having a head having a semi-circular shape;
    a carrier mounted to and slidably movable on said base, said carrier having carrier arms having ball support means and carrier arms arranged in rows on said carrier, slots between said carrier arms, cells arranged in an array on said carrier arms for receiving balls of a miniature grid array package;
    said contacts of said base protruding through said slots adjacent said carrier arms;
    carrier channels of said base for receiving said carrier arms; and
    wherein said carrier arms are moved against said balls of a miniature grid array package so that said balls slide past a curved side of the contact head in order to achieve a fully mated position offset from the center point of said contacts.

2. The socket of claim 1 wherein said carrier is mounted to said base with a zero insertion force.

3. The socket of claim 1 wherein the carrier member includes slots which allow for inspection of a mated miniature grid array package mounted thereto.

4. The socket of claim 1 wherein said array of contacts provide a footprint of said socket corresponding to a miniature grid array package mounted thereto.

5. The socket of claim 1 wherein metal-to-metal connection is made between said socket and a miniature grid array package mounted thereto.

6. The socket of claim 1 wherein said contacts have a contact head having a semi-circular shape.

7. The socket of claim 1 wherein said carrier arms have ball support means alternatingly oriented along the length of the carrier arm corresponding to the alternatingly oriented contacts adjacent the carrier arm.

8. The socket of claim 1 wherein said contacts are oriented in rows alternatingly on opposite sides of said carrier arms.

9. A zero insertion force ball grid array socket comprising:
    a base having an array of passages therein;
    contacts mounted in said passages;
    a ball grid array package having balls protruding therefrom;
    a carrier means for receiving said balls in a nonmated position with a zero insertion force, the carrier means including slots which allow for the inspection of a mated miniature grid array package mounted thereto;
    a sliding means for moving said carrier means said balls to said contacts;
    ball support means adjacent said balls; and
    wherein said contacts include surface mount tails, shoulders, a head having a semi-circular shape and a beam having a length and an angle sufficient to provide for mating said head to said balls at a position above an equator of said balls.

10. The socket of claim 9 including carrier guides protruding from said base and defining rows of carrier channels and said passages.

11. The socket of claim 9 wherein said carrier includes keys for positioning the carrier within said base and heat sink clip mounts.

12. The socket of claim 9 wherein said carrier includes an indentation along its outer edge allowing for insertion of a pry tool to aid in the sliding of said carrier into a mating position.

13. The socket of claim 9 wherein said contacts include surface mount tails which are exposed in an upwardly perpendicular direction while the socket is carried on a circuit board.

14. The socket of claim 9 wherein said receiving means are arranged in rows having slots therebetween; and
    said passages arranged in rows corresponding to said slots.

15. The socket of claim 9 wherein said base includes an aperture having a rectangular shape corresponding to a carrier mounted therein, said aperture having a length greater than a length of said carrier by a measure equal to a distance said balls are slid into a mated position.

16. The socket of claim 9 including two hundred and fifty-six passages.

17. The socket of claim 9 including said contacts on a 0.050 inch grid.

18. The socket of claim 9 having the balls in a mated position wherein the centerline of the balls are offset from the apex point of the contacts.

19. The socket of claim 9 wherein said receiving means and said sliding means include a carrier having carrier arms having an array of cells for receiving said balls and slidingly mounted to said base.

20. The socket of claim 19 wherein said rows of contacts are alternatingly positioned on opposite sides of the carrier arm.

* * * * *